United States Patent
Wang et al.

(10) Patent No.: US 9,893,097 B2
(45) Date of Patent: Feb. 13, 2018

(54) LTPS ARRAY SUBSTRATE AND METHOD FOR PRODUCING THE SAME

(71) Applicants: Shenzhen China Star Optoelectronics Technology Co., Ltd., Shenzhen, Guandong (CN); Wuhan China Star Optoelectronics Technology Co., Ltd., Wuhan, Hubei (CN)

(72) Inventors: Cong Wang, Guangdong (CN); Peng Du, Guangdong (CN)

(73) Assignees: Shenzhen China Star Optoelectronics Technology Co., Ltd., Shenzhen, Guangdong (CN); Wuhan China Star Optoelectronics Technology Co., Ltd, Wuhan, Hubei (CN)

(*) Notice: Subject to any disclaimer, the term of this patent is extended or adjusted under 35 U.S.C. 154(b) by 229 days.

(21) Appl. No.: 14/762,458

(22) PCT Filed: Jun. 17, 2015

(86) PCT No.: PCT/CN2015/081635
§ 371 (c)(1),
(2) Date: Jul. 21, 2015

(87) PCT Pub. No.: WO2016/197400
PCT Pub. Date: Dec. 15, 2016

(65) Prior Publication Data
US 2017/0141139 A1    May 18, 2017

(30) Foreign Application Priority Data
Jun. 8, 2015 (CN) .......................... 2015 1 0310280

(51) Int. Cl.
*H01L 27/12* (2006.01)
*H01L 29/66* (2006.01)
*H01L 29/786* (2006.01)

(52) U.S. Cl.
CPC .... *H01L 27/1288* (2013.01); *H01L 29/66765* (2013.01); *H01L 29/78618* (2013.01); *H01L 29/78678* (2013.01)

(58) Field of Classification Search
CPC ...................... H01L 29/78678; H01L 27/1288
See application file for complete search history.

(56) References Cited

U.S. PATENT DOCUMENTS 6,855,954 B1 * 2/2005 Zhang ................. H01L 27/1214
257/57
7,915,102 B2 * 3/2011 Hwang ............... H01L 27/1288
257/E21.328

(Continued)

FOREIGN PATENT DOCUMENTS

| CN | 1921076 A | 2/2007 |
|---|---|---|
| CN | 102723307 A | 10/2012 |
| CN | 104466020 A | 3/2015 |

*Primary Examiner* — Anthony Ho
*Assistant Examiner* — Antonio Crite
(74) *Attorney, Agent, or Firm* — Andrew C. Cheng

(57) ABSTRACT

An LTPS array substrate and a method for producing the same are proposed. The method includes: forming a gate of a thin-film transistor (TFT) of the LTPS array substrate on a substrate; forming a first insulating layer, a semiconductor layer, and a positive photoresist layer on the substrate one by one; exposing one side of the substrate on the opposite side of the gate for forming a polycrystalline silicon layer; forming a second insulating layer on the substrate of the polycrystalline silicon layer; forming a source and a drain of the TFT on the second insulating layer so that the source and the drain is electrically connected to the polycrystalline silicon layer via a contact hole. The use of masks in types and in numbers in the LTPS technology will be reduced. So, both of the processes and the production costs are reduced.

6 Claims, 5 Drawing Sheets

(56) References Cited

U.S. PATENT DOCUMENTS

| | | | |
|---|---|---|---|
| 2012/0298518 A1* | 11/2012 | Joo | C25D 5/04 |
| | | | 205/137 |
| 2013/0168683 A1 | 7/2013 | Seo et al. | |
| 2015/0316814 A1* | 11/2015 | Nishiki | G02F 1/133512 |
| | | | 349/42 |

* cited by examiner

LTPS ARRAY SUBSTRATE AND METHOD FOR PRODUCING THE SAME

BACKGROUND OF THE INVENTION

1. Field of the Invention

The present invention relates to the field of display technology, and more particularly, to a low temperature poly-silicon (LTPS) array substrate and a method for producing the LTPS array substrate.

2. Description of the Prior Art

Higher electron mobility is demonstrated in a liquid crystal display (LCD) adopting LTPS. The square of a thin film transistor (TFT) is actually smaller in this kind of LCD in which the aperture rate of a pixel is higher, and the brightness is larger. Anyway, power consumption and production costs are less using an LCD with LTPS. Owing to these features, the research on the LCD with LTPS is popular in LCD technology. However, the LTPS technology is sophisticated. It requires a lot of masks in various types to fabricate an array substrate (array substrate). Also, it needs many processes to produce an array substrate. Therefore, production costs are always high, which is a problem. To find ways to reduce the masks used in the LTPS technology in numbers and types requires the whole industry to work together.

SUMMARY OF THE INVENTION

In view of this, an LTPS array substrate and a method for producing the LTPS array substrate is proposed by the embodiment of the present invention for the purpose of reducing the masks used in the LTPS technology in types and in numbers.

According to a preferred embodiment of the present invention, a method for producing a low temperature poly-silicon (LTPS) array substrate, comprises: forming a gate of a thin-film transistor (TFT) of the LTPS array substrate on a substrate; forming a first insulating layer, a semiconductor layer, and a positive photoresist layer on the substrate one by one in which an upper surface of the first insulating layer is a plane; exposing one side of the substrate on the opposite side of the gate for preserving the positive photoresist layer disposed on a first section disposed right above the gate only; injecting first impurity ions into the semiconductor layer outside the first section; exposing one side of the substrate on the opposite side of the gate for forming the positive photoresist layer disposed on a second section disposed right above the gate, and the second section being smaller than the first section; injecting second impurity ions into the semiconductor layer outside the second section; removing the positive photoresist layer disposed on the second section to form a polycrystalline silicon layer; forming a second insulating layer on the substrate of the polycrystalline silicon layer, and forming a first contact hole in the second insulating layer for exposing both sides of the polycrystalline silicon layer; forming a source and a drain of the TFT on the second insulating layer so that the source and the drain is electrically connected to the polycrystalline silicon layer via the first contact hole; forming a plain passivation layer on a source and drain electrode layer, which is fabricated from the source and the drain, and forming a second contact hole in the plain passivation layer for exposing surface of the drain; forming a common electrode of the LTPS array substrate on one side of the plain passivation layer where the second contact hole is far away from the TFT; forming a third insulating layer on the plain passivation layer and the common electrode layer and the third insulating layer, without covering the second contact hole; forming a pixel electrode on the plain passivation layer and electrically connected to the drain via the second contact hole.

Furthermore, before the insulating layer is formed on the substrate, the method further comprises: forming a buffer layer on the substrate without being covered by the gate and forming a plane using an upper surface of the buffer layer and an upper surface of the gate.

Furthermore, a step of forming the buffer layer on the substrate without being covered by the gate comprises: forming the buffer layer and a negative photoresist layer on the substrate one by one; exposing one side of the substrate on the opposite side of the gate for removing the negative photoresist layer disposed right above the gate; removing the buffer layer disposed right above the gate, and preserving the buffer layer disposed on the substrate without being covered by the gate.

Furthermore, the first impurity ions are N+ type impurity ions, and the second impurity ions are N− type impurity ions.

According to another embodiment of the present invention, a method for producing a low temperature poly-silicon (LTPS) array substrate, comprises: forming a gate of a thin-film transistor (TFT) of the LTPS array substrate on a substrate; forming a first insulating layer, a semiconductor layer, and a positive photoresist layer on the substrate one by one in which an upper surface of the first insulating layer is a plane; exposing one side of the substrate on the opposite side of the gate for forming a polycrystalline silicon layer; forming a second insulating layer on the substrate of the polycrystalline silicon layer, and forming a first contact hole in the second insulating layer for exposing both sides of the polycrystalline silicon layer; forming a source and a drain of the TFT on the second insulating layer so that the source and the drain is electrically connected to the polycrystalline silicon layer via the first contact hole.

Furthermore, before the insulating layer is formed on the substrate, the method further comprises: forming a buffer layer on the substrate without being covered by the gate and forming a plane using an upper surface of the buffer layer and an upper surface of the gate.

Furthermore, a step of forming the buffer layer on the substrate without being covered by the gate comprises: forming the buffer layer and a negative photoresist layer on the substrate one by one; exposing one side of the substrate on the opposite side of the gate for removing the negative photoresist layer disposed right above the gate; removing the buffer layer disposed right above the gate, and preserving the buffer layer disposed on the substrate without being covered by the gate.

Furthermore, a step of exposing one side of the substrate on the opposite side of the gate for forming a polycrystalline silicon layer comprises: exposing one side of the substrate on the opposite side of the gate for preserving the positive photoresist layer disposed on a first section disposed right above the gate only; injecting first impurity ions into the semiconductor layer outside the first section; exposing one side of the substrate on the opposite side of the gate for forming the positive photoresist layer disposed on a second section disposed right above the gate, and the second section being smaller than the first section; injecting second impurity ions into the semiconductor layer outside the second section; removing the positive photoresist layer disposed on the second section.

Furthermore, the first impurity ions are N+ type impurity ions, and the second impurity ions are N− type impurity ions.

Furthermore, a step of exposing one side of the substrate on the opposite side of the gate for forming the polycrystalline silicon layer comprises: exposing one side of the substrate on the opposite side of the gate for preserving the positive photoresist layer disposed on a first section disposed right above the gate only; injecting P type impurity ions into the semiconductor layer outside the first section; exposing one side of the substrate on the opposite side of the gate for forming the positive photoresist layer disposed on a second section disposed right above the gate, and the second section being smaller than the first section; removing the positive photoresist layer disposed on the second section.

Furthermore, after forming the source and the drain of the TFT on the second insulating layer, a step comprises: forming a plain passivation layer on a source and drain electrode layer, which is fabricated from the source and the drain, and forming a second contact hole in the plain passivation layer for exposing surface of the drain; forming a common electrode of the LTPS array substrate on one side of the plain passivation layer where the second contact hole is far away from the TFT; forming a third insulating layer on the plain passivation layer and the common electrode layer and the third insulating layer, without covering the second contact hole; forming a pixel electrode on the plain passivation layer and electrically connected to the drain via the second contact hole.

According to another embodiment of the present invention, a low temperature poly-silicon (LTPS) array substrate, comprises: a substrate; a gate, disposed on the substrate; forming a first insulating layer, a polycrystalline silicon layer, and a second insulating layer on the substrate one by one in which a first contact hole is formed in the second insulating layer; a source and a drain, disposed on the second insulating layer so that the source and the drain electrically connected to the polycrystalline silicon layer via the first contact hole; a plain passivation layer, disposed on a source and drain electrode layer fabricated from the source and the drain, and a second contact hole formed in the plain passivation layer for exposing surface of the drain; a third insulating layer, disposed on the plain passivation layer, without covering the second contact hole; a pixel electrode, disposed on the plain passivation layer and electrically connected to the drain via the second contact hole.

Furthermore, the LTPS array substrate further comprises a buffer layer, the buffer layer is disposed on the substrate without being covered by the gate, and an upper surface of the buffer layer and an upper surface of the gate form a plane.

Furthermore, the LTPS array substrate further comprises a common electrode, and the common electrode is formed on one side of the plain passivation layer where the second contact hole is far away from the TFT.

The fact about the LTPS array substrate and the method for producing the LTPS array substrate proposed by the present invention is that one side of a substrate on the opposite side of a gate is exposed for forming a polycrystalline silicon layer. In other words, an opaque gate is exposed for forming a polycrystalline silicon layer. It is unnecessary to use any masks in producing polycrystalline silicon layers so the use of masks in types and in numbers in the LTPS technology will be reduced. So, both of the processes and the production costs are reduced.

DETAILED DESCRIPTION OF THE PREFERRED EMBODIMENTS

The drawings illustrate embodiments of the invention and, together with the description, serve to explain the principles of the invention.

Figure 1:
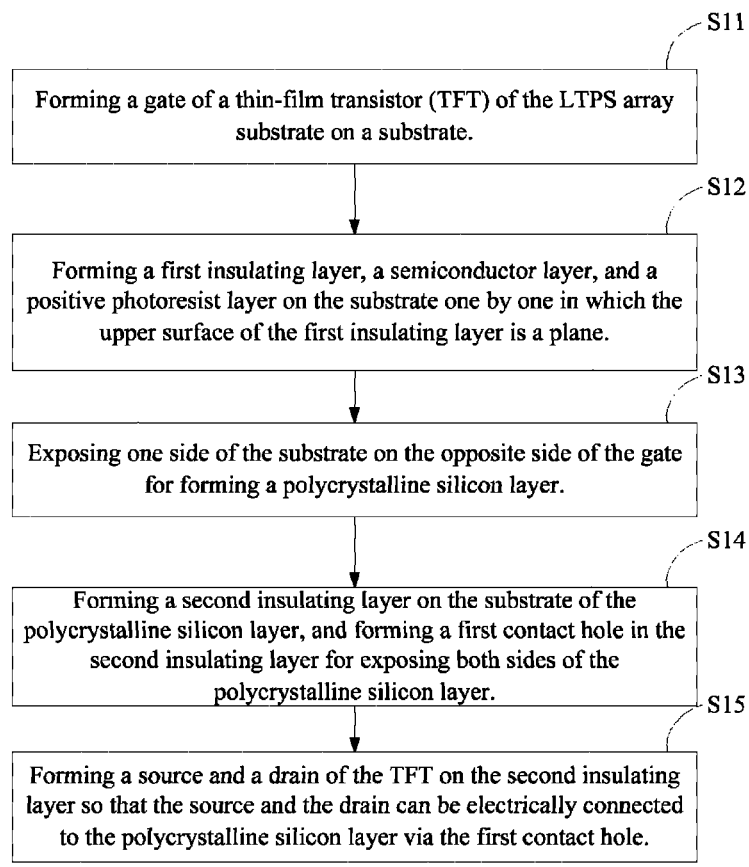
FIG. 1 is a flow chart of a method for producing an LTPS array substrate according to a preferred embodiment of the present invention.

FIG. 1 is a flow chart of a method for producing an LTPS array substrate according to one embodiment of the present invention. The method comprises following steps of:

Step 11: Forming a gate of a thin-film transistor (TFT) of the LTPS array substrate on a substrate.

Figure 2:
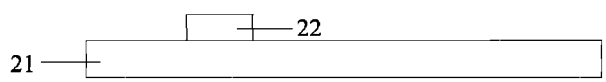
FIG. 2 shows a process of forming a gate according to the present invention.

Please refer to FIG. 2. The substrate 21 is used for forming the LTPS array substrate of an LCD panel. The substrate 21 can be a glass substrate, a plastic substrate, or a flexible-substrate.

A first metallic layer is formed on the substrate 21 and the first metallic layer is exposed through a first mask in this embodiment. The exposed first metallic layer is patterned after being developed and etched. Then, a gate 22 is formed. The first metallic layer is etched with etching liquid comprising phosphoric acid, nitric acid, acetic acid, and deionized water. Certainly, the first metallic layer can undergo dry etching as well.

Definitely, the gate 22 can be also acquired through other methods in this embodiment such as chemical vapor deposition (CVD), plasma enhanced chemical vapor deposition (PECVD), sputtering, vacuum evaporation deposition, or low pressure chemical vapor deposition (LP-CVD). The method of deposition is not confined in the specification. The gate 22 with a default pattern is formed on the substrate 21 directly. The first metallic layer is fabricated from metal such as aluminum (AL), molybdenum (Mo), titanium (Ti), chromium (Cr), or cuprum (Cu). Or, the first metallic layer is fabricated from metallic oxide, such as titanium oxide, or metallic alloy or other conducting materials.

Step 12: Forming a first insulating layer, a semiconductor layer, and a positive photoresist layer on the substrate one by one in which the upper surface of the first insulating layer is a plane.

Figure 3:
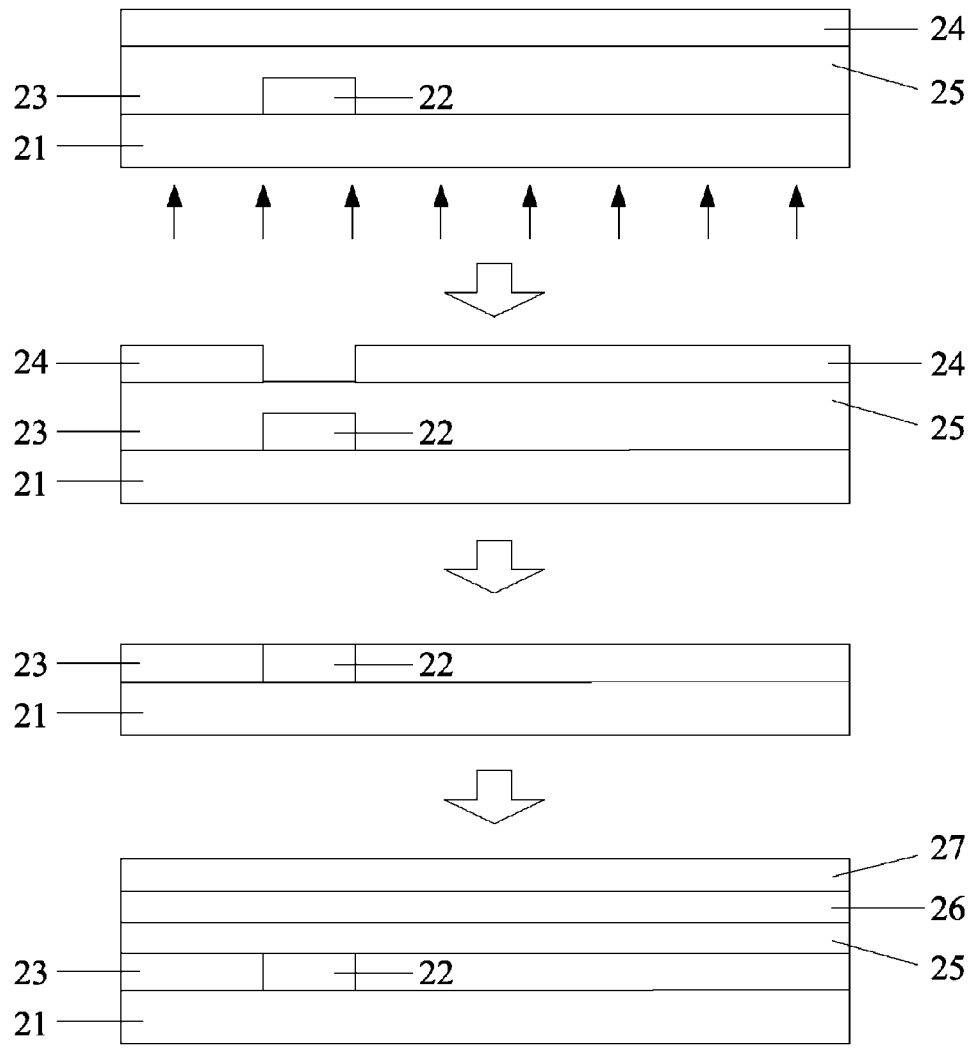
FIG. 3 shows a process of forming a first insulating layer, a semiconductor layer, and a positive photoresist formed on the substrate according to the present invention.

Please refer to FIG. 3 as well. A buffer layer 23 needs to be formed on the substrate 21 without being covered by the gate 22 before a first insulating layer 25, a semiconductor layer 26, and a positive photoresist layer 27 are formed in this embodiment. The concrete processes are described below while it does not mean that the processes are limited.

Firstly, the buffer layer 23 and the negative photoresist layer 24 are formed on the substrate 21 of the gate 22 one by one. The buffer layer 23 can be a $SiN_x$ layer, a $SiO_x$ layer or the combination of other non-conducting materials. The buffer layer 23 is used for preventing upward spreading of the impurity in the substrate 21 in the following processes so that the quality of an LTPS layer which will be formed in the following processes will not be affected. The $SiN_x$ layer and the $SiO_x$ layer are deposited through CVD, PECVD, sputtering, vacuum evaporation deposition, or LP-CVD. The method of deposition is not confined in the specification.

Next, one side of the substrate 21 on the opposite side of the gate 22 is exposed. The negative photoresist layer 24 disposed right above the gate 22 is not exposed under the shelter of the gate 22 so the negative photoresist layer 24 can be removed with ash after being developed.

Finally, the remaining negative photoresist layer 24 is peeled off. The buffer layer 23 disposed right above the gate 22 is etched and removed. Therefore, the buffer layer 23 without being covered by the gate 22 is preserved.

Step 13: Exposing one side of the substrate on the opposite side of the gate for forming a polycrystalline silicon layer.

Figure 4:
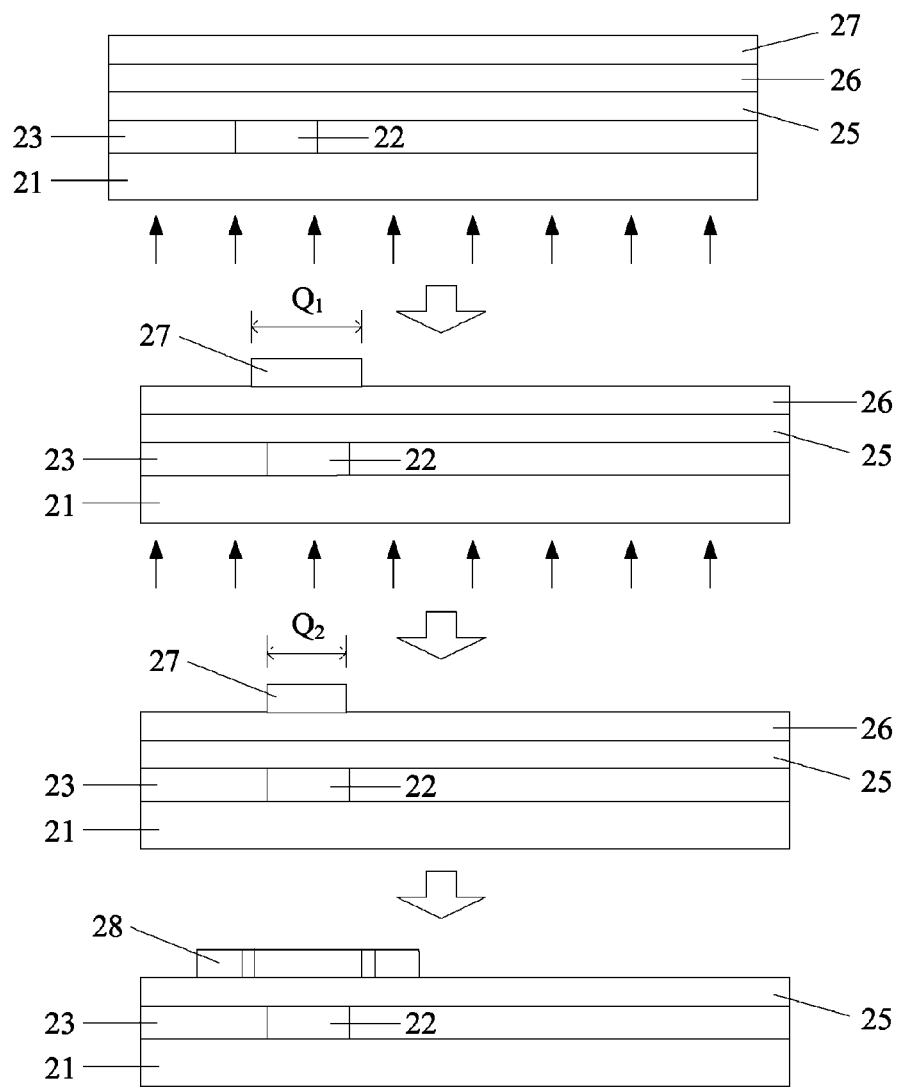
FIG. 4 shows a process of forming a polycrystalline silicon layer according to the present invention.

Please refer to FIG. 4 as well. Firstly, one side of the substrate 21 on the opposite side of the gate 22 is exposed. The positive photoresist layer 27 disposed on the first section $Q_1$ of the gate 22 is not exposed under the shelter of the gate 22 so the positive photoresist layer 27 can be preserved after being developed. The positive photoresist layer 27 without being exposed under the shelter of the gate 22 can be removed with ash after being developed. Therefore, only the positive photoresist layer 27 is preserved on the first section $Q_1$ disposed right above the gate 22 is preserved.

Next, first impurity ions are injected into the semiconductor layer 26 outside the first section $Q_1$. In other words, conventionally, the semiconductor layer 26 is heavily doped.

Next, one side of the substrate 21 on the opposite side of the gate 22 is exposed. The intensity of this exposure is larger than the intensity of exposure on the positive photoresist layer 27 formed on the first section $Q_1$. So the positive photoresist layer 27 disposed on both sides of the first section $Q_1$ is removed. So the positive photoresist layer 27 of the second section $Q_2$ is formed right above the gate 22. The second section $Q_2$ is smaller than the first section $Q_1$.

Further, second impurity ions are injected into the semiconductor layer 26 outside the second section $Q_2$. In other words, conventionally, the semiconductor layer 26 is softly doped. The first impurity ions in this embodiment can be N+ type impurity ions, and correspondingly, the second impurity ion can be N– type impurity ions. While the first impurity ion is P+ type impurity ions, the doping of the second impurity ion is unnecessary. In other words, soft doping is unnecessary.

Finally, the positive photoresist layer 27 on the second section $Q_2$ is removed. A polycrystalline silicon layer 28 with a default pattern is formed through exposure, development, and etching through a second mask, as shown in FIG. 4.

Step S14: Forming a second insulating layer on the substrate of the polycrystalline silicon layer, and forming a first contact hole in the second insulating layer for exposing both sides of the polycrystalline silicon layer.

Figure 5:
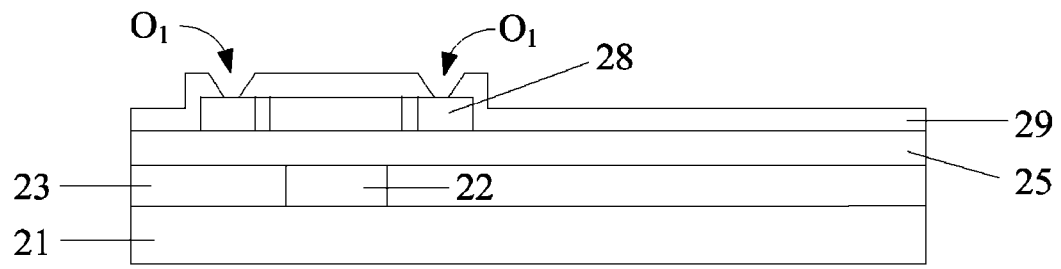
FIG. 5 shows a process of forming a second insulating layer according to the present invention.

A second insulating layer 29 covers the polycrystalline silicon layer 28 and the first insulating layer 25. A first contact hole $O_1$ is formed through exposure, development, and etching through a third mask in this embodiment, as shown in FIG. 5.

Step S15: Forming a source and a drain of the TFT on the second insulating layer so that the source and the drain can be electrically connected to the polycrystalline silicon layer via the first contact hole.

Figure 6:
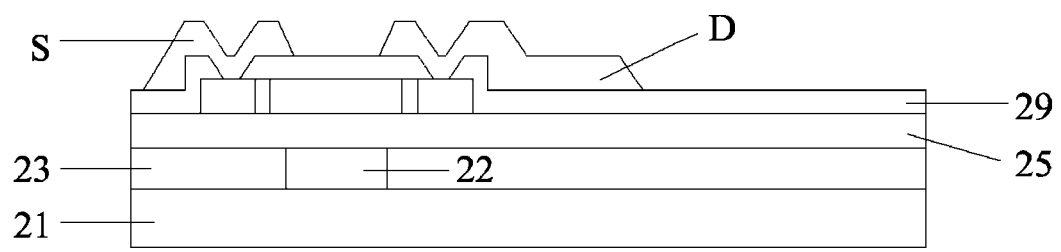
FIG. 6 shows a process of forming a source and a drain according to the present invention.

A source S and a drain D of the TFT are formed through exposure, development, and etching through a fourth mask in this embodiment, as shown in FIG. 6.

As mentioned above, one side of the substrate 21 on the opposite side of the gate 22 is exposed. In other words, the opaque gate 22 is exposed for forming the polycrystalline silicon layer 28 without using any masks. Therefore, the type and number of masks for producing the conventional LTPS array panel is reduced. It not only simplifies the manufacture procedure but also reduces costs.

Figure 7:
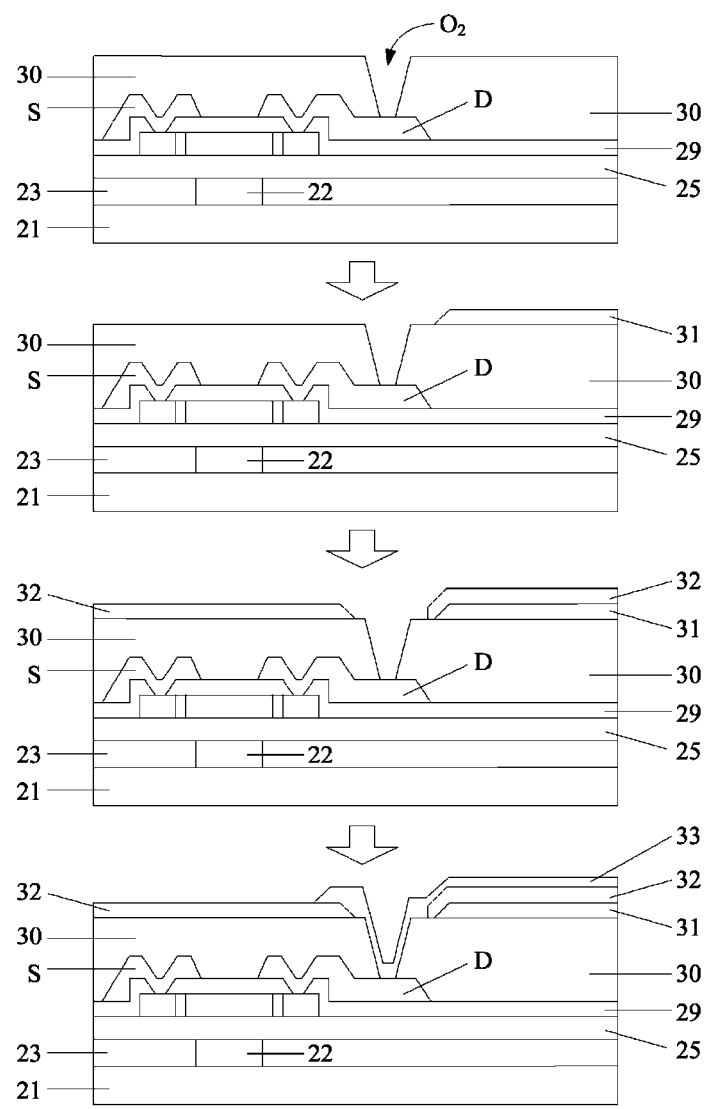
FIG. 7 shows a process of forming a pixel electrode according to the present invention.

Please refer to FIG. 7. The method proposed by this embodiment of the present invention further comprises following steps of:

Forming a plain passivation layer 30 on a source and drain electrode layer, which is fabricated from the source S and the drain D, and forming a second contact hole $O_2$ in the plain passivation layer 30 for exposing the surface of the gate D. The second contact hole $O_2$ is formed through exposure, development, and etching through a fifth mask.

Forming a common electrode 31 of the LTPS array substrate on one side of the plain passivation layer 30 where the second contact hole $O_2$ is far away from the TFT. The common electrode 31 with a default pattern is formed through exposure, development, and etching through a sixth mask.

Forming a third insulating layer 32 on the plain passivation layer 30 and the common electrode 31. The second contact hole $O_2$ is not covered by the third insulating layer 32. The third insulating layer 32 with a default pattern is formed through exposure, development, and etching through a seventh mask. Furthermore, the third insulating layer 32 with a default pattern can be also formed through CVD, PECVD, sputtering, vacuum evaporation deposition, or LP-CVD directly. The method of deposition is not confined in the specification.

A pixel electrode 33 is formed on the plain passivation layer 30. The pixel electrode 33 is electrically connected to the drain D via the second contact hole $O_2$. The pixel electrode 33 with a default pattern is formed through exposure, development, and etching through an eighth mask. Moreover, the gate 22 of the TFT is correspondingly electrically connected to a gate wire formed on the substrate 21 (array substrate). The source S of the TFT is correspondingly electrically connected to a data wire formed on the array substrate. The gate wire and the data wire are vertically crossed and form a pixel display section where the pixel electrode 33 is disposed.

The present invention further proposes an LCD panel comprising the LTPS array panel as shown in FIG. 7 and an LCD. The benefit is as what is described above.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:

1. A method for producing a low temperature poly-silicon (LTPS) array substrate, comprising:

forming a gate of a thin-film transistor (TFT) of the LTPS array substrate on a substrate;

forming a buffer layer and a negative photoresist layer on the substrate one by one;

exposing one side of the substrate on the opposite side of the gate for removing the negative photoresist layer disposed right above the gate;

removing the buffer layer disposed right above the gate, and preserving the buffer layer disposed on the substrate without being covered by the gate;

forming a first insulating layer, a semiconductor layer, and a positive photoresist layer on the substrate one by one in which an upper surface of the first insulating layer is a plane;

exposing one side of the substrate on the opposite side of the gate for preserving the positive photoresist layer disposed on a first section disposed right above the gate only;

injecting first impurity ions into the semiconductor layer outside the first section;

exposing one side of the substrate on the opposite side of the gate for forming the positive photoresist layer disposed on a second section disposed right above the gate, and the second section being smaller than the first section;

injecting second impurity ions into the semiconductor layer outside the second section;

removing the positive photoresist layer disposed on the second section to form a polycrystalline silicon layer;

forming a second insulating layer on the substrate of the polycrystalline silicon layer, and forming a first contact hole in the second insulating layer for exposing both sides of the polycrystalline silicon layer;

forming a source and a drain of the TFT on the second insulating layer so that the source and the drain is electrically connected to the polycrystalline silicon layer via the first contact hole;

forming a plain passivation layer on a source and drain electrode layer, which is fabricated from the source and the drain, and forming a second contact hole in the plain passivation layer for exposing surface of the drain;

forming a common electrode of the LTPS array substrate on one side of the plain passivation layer where the second contact hole is far away from the TFT;

forming a third insulating layer on the plain passivation layer and the common electrode layer, wherein the third insulating layer does not cover the second contact hole; and forming a pixel electrode on the plain passivation layer and electrically connected to the drain via the second contact hole.

2. The method of claim 1, wherein the first impurity ions are N+ type impurity ions, and the second impurity ions are N− type impurity ions.

3. A method for producing a low temperature poly-silicon (LTPS) array substrate, comprising:

forming a gate of a thin-film transistor (TFT) of the LTPS array substrate on a substrate;

forming a buffer layer and a negative photoresist layer on the substrate one by one;

exposing one side of the substrate on the opposite side of the gate for removing the negative photoresist layer disposed right above the gate;

removing the buffer layer disposed right above the gate, and preserving the buffer layer disposed on the substrate without being covered by the gate;

forming a first insulating layer, a semiconductor layer, and a positive photoresist layer on the substrate one by one in which an upper surface of the first insulating layer is a plane;

exposing one side of the substrate on the opposite side of the gate for forming a polycrystalline silicon layer;

forming a second insulating layer on the substrate of the polycrystalline silicon layer, and forming a first contact hole in the second insulating layer for exposing both sides of the polycrystalline silicon layer;

forming a source and a drain of the TFT on the second insulating layer so that the source and the drain is electrically connected to the polycrystalline silicon layer via the first contact hole.

4. The method of claim 3, wherein a step of exposing one side of the substrate on the opposite side of the gate for forming a polycrystalline silicon layer comprises:

exposing one side of the substrate on the opposite side of the gate for preserving the positive photoresist layer disposed on a first section disposed right above the gate only;

injecting first impurity ions into the semiconductor layer outside the first section;

exposing one side of the substrate on the opposite side of the gate for forming the positive photoresist layer disposed on a second section disposed right above the gate, and the second section being smaller than the first section;

injecting second impurity ions into the semiconductor layer outside the second section;

removing the positive photoresist layer disposed on the second section.

5. The method of claim 4, wherein the first impurity ions are N+ type impurity ions, and the second impurity ions are N− type impurity ions.

6. The method of claim 3, wherein after forming the source and the drain of the TFT on the second insulating layer, steps comprise:

forming a plain passivation layer on a source and drain electrode layer, which is fabricated from the source and the drain, and forming a second contact hole in the plain passivation layer for exposing surface of the drain;

forming a common electrode of the LTPS array substrate on one side of the plain passivation layer where the second contact hole is far away from the TFT;

forming a third insulating layer on the plain passivation layer and the common electrode layer, wherein the third insulating layer does not cover the second contact hole;

forming a pixel electrode on the plain passivation layer and electrically connected to the drain via the second contact hole.

* * * * *